(12) United States Patent  (10) Patent No.: US 9,380,540 B1
Hermann et al.  (45) Date of Patent: Jun. 28, 2016

(54) KEY FOB TRANSMISSION COMPENSATION

(71) Applicant: Ford Global Technologies, LLC, Dearborn, MI (US)

(72) Inventors: Thomas Joseph Hermann, Troy, MI (US); Tye Arthur Winkel, Canton, MI (US); John Locke, Rochester, MI (US); Lawrence Banasky, Jr., Livonia, MI (US); Mark Wisnewski, Stockbridge, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 14/672,534

(22) Filed: Mar. 30, 2015

(51) Int. Cl.
*H04B 7/00* (2006.01)
*H04W 52/18* (2009.01)
*G07C 9/00* (2006.01)

(52) U.S. Cl.
CPC ..... *H04W 52/18* (2013.01); *G07C 2009/00769* (2013.01); *G07C 2009/00984* (2013.01)

(58) Field of Classification Search
CPC ... H04W 52/16; H04W 52/325; H04W 28/18; H04W 52/04; H04W 52/265; H04W 72/085; H04W 52/146; H04W 52/08; H04W 12/04
USPC .......... 455/522, 69, 68, 127.1, 500, 517, 445, 455/507, 513, 516, 515, 73, 550.1, 90.3, 455/575.1, 575.7, 575.9, 344, 345, 422.1, 455/403; 340/572.7, 572.4, 10.1, 10.3, 340/572.8; 343/720
See application file for complete search history.

(56) References Cited

U.S. PATENT DOCUMENTS

| | | | |
|---|---|---|---|
| 6,127,740 A | 10/2000 | Roddy et al. | |
| 7,724,125 B2 | 5/2010 | Ghabra et al. | |
| 7,933,324 B2 | 4/2011 | Ghabra et al. | |
| 7,944,340 B1 | 5/2011 | Ghabra et al. | |
| 2002/0028663 A1* | 3/2002 | Tang | B60R 25/24 455/127.2 |
| 2009/0243796 A1 | 10/2009 | Tieman | |

OTHER PUBLICATIONS

Delphi key fob could provide 1-km range, SAE International, Apr. 27, 2010 (2 pages).

* cited by examiner

*Primary Examiner* — Keith Ferguson
(74) *Attorney, Agent, or Firm* — Frank A. MacKenzie; Bejin Bieneman PLC

(57) ABSTRACT

A method comprising for adjusting a power level in a key fob includes transmitting a first output signal at a first power setting. A feedback signal is received via a feedback mechanism that indicates a first power level of the first output signal. The first output level is compared to a threshold level. A second output signal at a second power setting greater than the first power setting is transmitted if the first output power level is below the threshold.

20 Claims, 5 Drawing Sheets

KEY FOB TRANSMISSION COMPENSATION

CROSS-REFERENCE TO RELATED APPLICATIONS

This application is related to U.S. patent application Ser. No. 14/672,521, filed Mar. 30, 2015 entitled "KEY FOB TRANSMISSION COMPENSATION" and U.S. patent application Ser. No. 14/672,544, filed Mar. 30, 2015 entitled "FOB CASE FOR REDUCED TRANSMISSION INTERFERENCE", the complete contents of which are hereby incorporated herein by reference in their entirety.

BACKGROUND

A remote keyless entry system (RKE system) includes a remote device, sometimes called a fob or key fob, used by a vehicle operator and in communication with a base unit embedded in a vehicle. The RKE system's range, i.e., the distance between the key fob operated by the vehicle operator and the base unit, is a characteristic of perceived system quality. The system's range varies according to the fob's radio frequency (RF) output power, which is limited by federal regulation.

DESCRIPTION

Introduction

The fob's regulated power level is measured in "free space" without a human hand touching or proximate the key fob. A human hand proximate a transceiver antenna in the fob may interfere with transmission and reduce the RF output power. A human-fob interaction may change the antenna pattern so that there is less gain in the direction of the vehicle. Additionally, when a fob battery is approaching end of life (has lost most of its charge) the fob's output power may be reduced. Reduced output power reduces the RKE system's range, potentially resulting in operator dissatisfaction.

Figure 1:
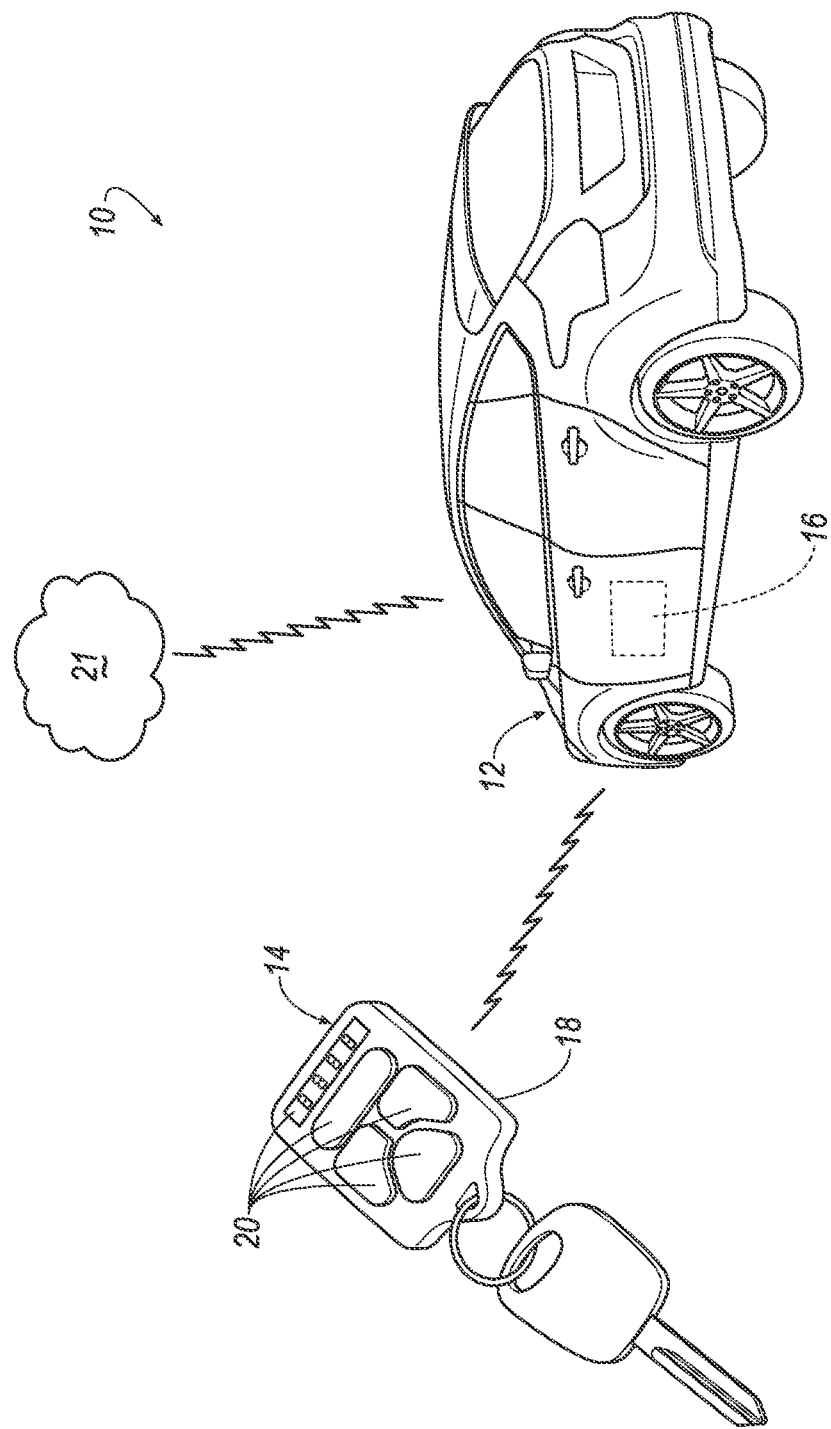
FIG. 1 is diagram of an exemplary remote keyless entry system.

FIG. 1 illustrates an exemplary remote keyless entry (RKE) system 10 for a vehicle 12 including one or more mechanisms for adjusting output power to compensate for interference from an object, e.g., an operator. The RKE system 10 provides for remote control from a key fob 14 for various vehicle 12 applications such as door locks, trunk latch, interior and exterior lights, engine start, climate control, etc. The vehicle 12 is generally a land-based vehicle having two or more wheels, e.g., a passenger car, light truck, a motorcycle, etc. The vehicle 12 includes a base station 16 for receiving messages from the key fob 14 and optionally transmitting messages to the key fob 14.

The key fob 14 transmits messages to the base station 16 and may also receive messages from the base station 16. The key fob 14 includes a housing 18 and an interface 20. The interface 20 receives input from and provides output to an operator.

In order to determine an output power setting, the key fob 14 may include one or more sensors for detecting the presence of an operator proximate to, or holding the key fob 14. The key fob 14 may further include one or more feedback mechanisms for detecting an actual output power level, and comparing the detected output power level to a stored threshold value. Based on the information from the sensors and/or feedback mechanisms, the key fob 14 may adjust an output power level. Adjusting the output power level of the key fob 14 to compensate for interference allows, for example, the key fob 14 to communicate with the vehicle 12 over a longer range, and may increase operator satisfaction with the RKE system 10. In addition to adjusting the output power level of the key fob 14, adjustments to other communications parameters, such as time-to-sleep mode (the delay time between sending a transmission and receiving a response), data rate, preamble time, etc. may be made.

System Elements

Figure 2:
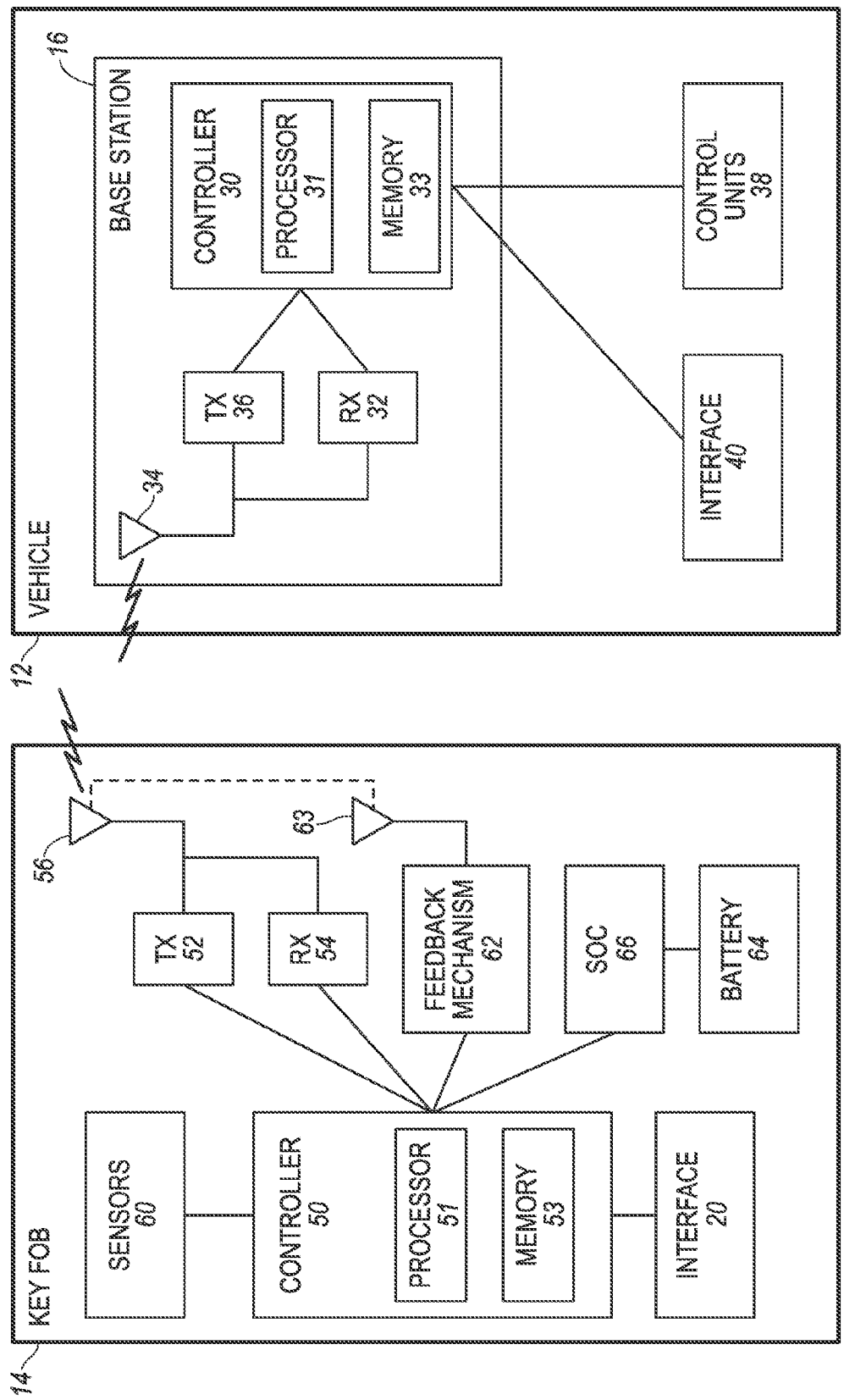
FIG. 2 is a block diagram of the exemplary remote keyless entry system of FIG. 1.

As shown in FIG. 2, the vehicle 12 includes the base unit 16 and further includes control units 38 and an interface 40.

The base station 16 includes a controller 30 including a processor 31 for executing programs stored in a memory 33. The base station 16 further includes a receiver 32 and transmitter 34, both in communication with the controller 30. The base station 16 further includes one or more transceiver antennas 36 for receiving output signals from the key fob 14 and passing the output signals to the receiver 32. In the case that the base station 16 includes a transmitter 34, the transmitter 34 may also use the one or more transceiver antennas 36 for transmitting messages to the key fob 14.

The base station 16 is in direct or indirect communication with one or more control units 38. The control units 38 may control various functions of the vehicle 12 such as door locks, a trunk latch, interior/exterior lighting, climate control, engine start, etc. Each control unit 38 may have a processor for receiving instructions from the base station and controlling an actuator. For example, a door lock control unit may include a processor and a motor (or solenoid) for opening/closing a door lock. Further, the control units 38 may be able to send messages to the controller 30 of the base station 16. For example, the door lock control unit 38 may send a signal to the base station 16 controller 30 that the door has been locked.

Communication between the controller 30 and the control units 38 may be conducted over a network bus, for example on a CAN (Controller Area Network) bus, or other wired or wireless mechanisms. The controller 30 may include one or more processors. In the case that the controller 30 includes more than one processor, communication between the processors may also be conducted over a network bus. In addition, the controller 30 may be configured for communicating with other devices via various wired and/or networking technologies, e.g., cellular, Bluetooth®, a universal serial bus (USB), wired and/or wireless packet networks, etc.

Additionally, the vehicle 12 generally includes an interface 40. In general, the interface 40 is equipped to accept inputs for, and/or provide outputs from, the controller 30. For example, the vehicle 12 may include one or more of a display configured to provide a graphical operator interface (GUI) or the like, an interactive voice response (IVR) system, audio output devices, mechanisms for providing haptic output, etc., providing communication between the vehicle 12 and the operator. Further, an operator device, e.g., a portable computing device such as a tablet computer, a smart phone, or the like, may be used to provide some or all of an interface 40 to the controller 30. For example, an operator device could be connected to the controller 30 using technologies discussed above, e.g., USB, Bluetooth®, etc., and could be used to accept inputs for and/or provide outputs from the controller 30.

The controller 30, may be configured, directly or indirectly, i.e., via another computing device in the vehicle 12, to communicate with a network 21. The network 21 represents one or more mechanisms by which the vehicle 12 may communicate with remote computing devices, and may be one or more of various wired or wireless communication mechanisms, including any desired combination of wired (e.g., cable and fiber) and/or wireless (e.g., cellular, wireless, satellite, microwave and radio frequency) communication mechanisms and any desired network topology (or topologies when multiple communication mechanisms are utilized). Exemplary communication networks include wireless communication networks (e.g., using Bluetooth, IEEE 802.11, etc.), local area networks (LAN) and/or wide area networks (WAN), including the Internet, providing data communication services.

As shown in FIG. 2, the fob 14 includes a controller 50 including a processor 51 and a memory 53. The processor 51 is configured to execute programs stored in the memory 53, and to control various functions of the fob 14, e.g., transmitting messages to the vehicle 12, receiving messages from the vehicle 12, calibrating an output power level, etc. As described below, the processor 51 may also be programmed to implement one or more processes to adjust the output power level during operation.

The fob 14 further includes a transmitter 52 and at least one transceiver antenna 56. The transmitter 52 is communicatively coupled to the controller 50 and is configured to transmit RF messages via the transceiver antenna 56 to the vehicle 12. The transmitter 52 includes a calibration mechanism for establishing a maximum output power setting and a setting mechanism for adjusting the output power level during operation.

In order to support two-way communication, the fob 14 may include a receiver 54 communicatively coupled to the controller 50. The receiver 54 may be configured to receive, via the transceiver antenna 56, RF communications from, e.g., the vehicle 12.

The at least one transceiver antenna 56 may include, e.g., first and second transceiver antennas 56. Under some operating conditions the processor 51 may be programmed to use both the first and second transceivers 56 in a balanced configuration for a transmitting or receiving a message. That is, in a transmit mode, each of the first and second transceiver antennas 56 could transmit at, for example, a substantially equal power level). Under other operating conditions, the processor 51 may be programmed to select one of the two transceiver antennas 56 to be used for a transmission or reception, and to disable the other antenna 56 during the transmission or reception. In yet another operating condition, the processor 51 could adjust a tuning between the first and second transceiver antennas. As described below, the processor may consider operating conditions such as the position of a hand holding the fob 14 to determine which, how many, and the tuning between transceiver antennas 56 to use for the transmission or reception.

As discussed above, the fob 14 includes an interface 20 for receiving input from and providing output to an operator, such as the driver of the vehicle 12. The interface 20 includes one or more input devices and may include a display. The input devices may be buttons, a touch screen display, a gesture sensing device, etc., for receiving input from an operator. The display may include an LCD display, LED display, buzzers, speakers, haptic feedback, etc., for providing information to the operator.

The fob 14 may include one or more sensors 60, which may be communicatively coupled with the controller 50. The sensors 60 may be used to detect the presence of an object, such as a human hand, proximate or in direct contact with the fob 14. The sensors 60 may further detect if the object is proximate the transceiver antenna 56. For example, the sensors 60 may include one or more capacitive sensors, resistive sensors, electromagnetic sensors, optical sensors, etc. In addition to detecting the presence of an object and proximity of the object to the transceiver antenna 56, the sensors 60 may detect, e.g., a size, position, orientation, conductivity or other characteristic of the object. The sensors 60 may be arranged in an array, for example a 3×3 array of capacitive sensors, distributed over a surface of the fob 14, in order to receive additional information regarding characteristics of the object proximate the fob 14.

Additionally or alternatively, sensors 60 may include accelerometers, gyroscopes, magnetic field sensors, etc., used to detect movement or orientation of the fob 14. The processor 51 may be programmed, for example, based on the movement of the fob 14 as detected by one or more sensors 60 to determine whether the fob 14 is being held by a person, in a person's pocket, stationary, etc.

The fob 14 may further include a feedback mechanism 62 for sending a feedback signal representative of output power level to the controller 50. The feedback mechanism may include an RF sensing element 63. The RF sensing element 63 may be, for example, a trace on a printed circuit board, spaced away from the transceiver antenna 56. Additionally or alternatively, in the case where there is more than one transceiver antenna 56, the controller 50 may control the fob 14 such that, when one transceiver antenna 56 is used for transmitting a message, another transceiver antenna 56 is used as the RF sensing element 63.

A battery 64 supplies power to the fob 14. The fob 14 may include a state-of-charge unit (SOC) 66 to monitor the state-of-charge of the battery 64. The SOC 66 may monitor an output voltage, output current, output resistance, etc., of the battery 64. Based on these monitored values, a computing device in the SOC 66, the processor 51 or another computing device may determine an estimated state-of-charge of the battery 64. Based on the determination of a battery low charge state, the processor 51 may adjust the output power level and/or adjust other communication parameters. Additionally or alternatively, the processor 51 may communicate the state-of-charge information to the vehicle 12.

Calibration of Maximum Output Power Level

In order to minimize or possibly avoid interference with other communication systems, and when applicable, to comply with regulations, the fob 14 may be calibrated to transmit at an output power level less than or equal to a maximum power level. A test may be conducted on an exemplary sample of a fob 14 according to a specific design type or model. The fob 14 may transmit a message at a known output power setting under known conditions. In order to prevent interference from the presence of a human hand or other conductive object, the fob 14 may be activated (for example, a transmit button may be depressed), by an object made of non-conductive material. The output power level may be measured by a measurement unit at a known distance, e.g., one meter, three meters, etc., from the fob 14. Based on the measured output power level, a component value in the fob 14 transmitter 52 may be adjusted or a power level setting correction determined. The component adjustment or power level setting correction may be included in the manufacture of fobs 14 with the same design type or model. For example, an initial or first power level setting, corresponding to the maximum power level under calibration conditions, may be stored in the memory 53 of the controller 50.

Compensating for Interference

Adjustment Based on Object Detection

An object, for example, a human hand, proximate the transceiver antenna 56 of the fob 14 may cause a reduction of the output power level of the fob 14 and interfere with a transmission. As noted above, the human-fob interaction may change the antenna pattern so that there is less gain in the direction of the vehicle. This may cause a reduction in range of the RKE system and result in reduced operator satisfaction. In order to compensate for the reduction in output power level, the fob 14 may adjust an output power setting based on the detection of an object proximate the transceiver antenna 56. Proximate the transceiver antenna 56 may be defined, for example, as directly contacting at least one sensor 60 on the fob 14 housing 18. As another example, proximate the transceiver antenna 56 may be defined as touching the fob 14 housing within three centimeters of the transceiver antenna 56 on a particular side of the fob 14 (for example, the side typically pointed toward the vehicle 12 when the fob 14 is operated). As yet another example, proximate the transceiver antenna 56 could be defined as within a detectable range of a gesture recognition system 60 included in the fob 14, for example five centimeters.

Sensors 60 may be used to detect the presence of the object proximate the transceiver antenna 56. The sensors 60, upon detecting an object, may provide data to the controller 50. For example, one or more capacitive sensors 60 may be included in the housing 18 of the fob 14. The one or more capacitive sensors 60 may be positioned to detect a hand or other object touching the fob 14 three centimeters or less from the transceiver antenna 56.

As another example, the sensors 60 may include gesture or proximity sensors as are known, e.g., optical, capacitive, magnetic sensors 60. The sensors 60 may detect the presence of a hand or other object in a space proximate the transceiver antenna 56, whether or not the object is directly contacting the fob 14.

Based on the detection of the object, the sensors 60 may send a message to the processor 51 indicating the presence of an object proximate the transceiver antenna 56. Based on the message, the processor 51 may adjust an output power setting by a predetermined adjustment factor. The predetermined adjustment factor may be an amount determined to compensate the output power level for the interference caused by the object without exceeding the maximum power level. The predetermined adjustment factor may be determined empirically. For example, tests may be conducted in a controlled environment to determine a minimum power loss which occurs when an object is proximate the transceiver antenna 56. The predetermined adjustment factor may be determined to compensate the minimum power loss. A margin of error may be included in the determination of the predetermined adjustment factor to allow for variations in performance of individual units and variations due to differences between objects.

Figure 3:
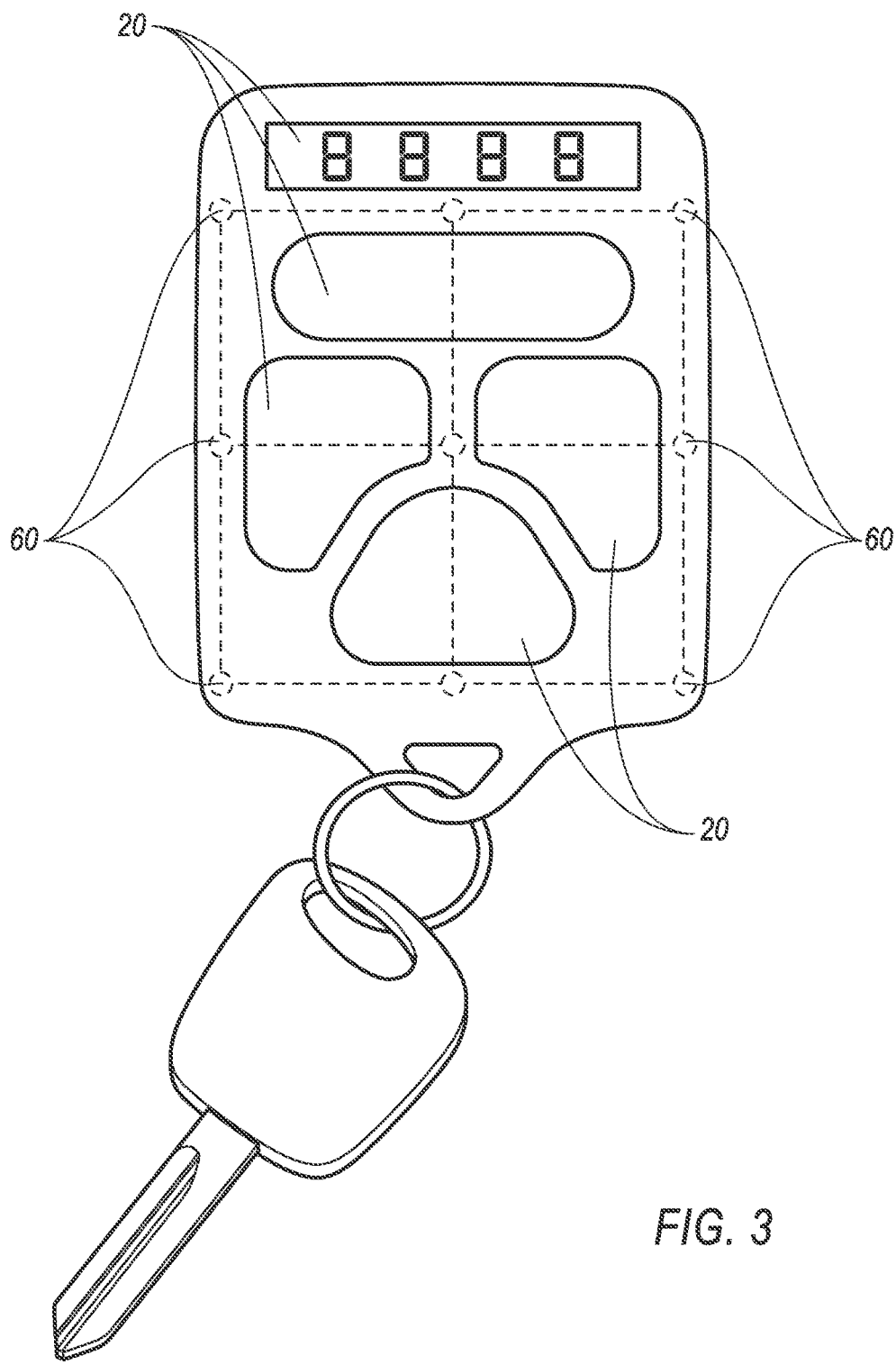
FIG. 3 is a perspective view of the key fob of FIG. 1, including a capacitive sensor grid array.

In addition to detecting the presence of an object proximate the transceiver antenna 56, the sensors 60 may detect, and report to the processor 51, additional characteristics regarding the object. For example, as shown in FIG. 3, the fob 14 may include a capacitive sensor array 60 including a plurality of capacitive sensors arranged at various positions on the fob 14. Based on signals from the capacitive sensor array 60, the processor 51 may determine that an object is, e.g., proximate a right side of the fob 14. Based on the determination, the processor 51 may, for example, use a first transceiver antenna 56 on a left side of the fob 14 for transmitting a message and disable a second transceiver antenna 56 on the right side of the fob 14, or adjust a tuning between the first and second transceiver antennas 56.

As another example, based on input from the sensors 60, the controller 50 may estimate a level of interference. The processor 51 may receive input, for example, that the object is covering a small area or large area surrounding the transceiver antenna 56 and select from one or more predetermined adjustment factors based on the estimated level of interference.

As noted above, in addition to adjusting the output power level of the key fob 14, adjustments to other communication parameters, such as time-to-sleep mode, data rate, preamble time, etc. may be made.

The sensors 60 may be used to prevent accidental activation of the fob 14. For example, the processor 51 may be programmed to only receive input from the interface 20 when, based on input from the sensors 60, the controller determines that an object (such as a human hand) is in contact with the fob 14.

Additionally or alternatively, some sensors 60 may only be activated (powered on) when the processor 51 has received input from the interface 20. In this manner, power consumption of the sensors 60 could be reduced.

Adjustment Based on Feedback

A feedback mechanism 62 may be used to monitor and adjust the output power level of the fob 14. As described above, an RF sensing element 63 or other antenna included in the fob 14 may receive an output signal from the transceiver antenna 56. The RF sensing element 63 or other antenna may pass the output signal to the feedback mechanism 62. Based on the received output signal the feedback mechanism may provide a feedback signal to the processor 51. By monitoring the feedback signal, the processor 51 may know when the output signal is approaching the maximum power level.

In an exemplary process, the processor 51 initially determines a feedback signal level corresponding to the maximum power level. During calibration, as described above, an exemplary fob 14 is adjusted to operate at a maximum power level 14. During operation at the maximum power level, the controller 50 may receive and store in memory 53 the level of the feedback signal corresponding to the maximum power level. Based at least partially on this level, a stored threshold value may be determined. For example, the stored threshold value may be determined as the level of the feedback signal during fob 14 operation at the maximum power level, minus a margin factor, as described below.

During transmission by the fob 14 in a standard operating mode, the feedback signal may be monitored by the processor 51. If the feedback signal is below the stored threshold value, the processor 51 may increase the output power setting.

The margin factor may be determined to account for variations in the manufacturing process of the fob 14. The margin factor may further be determined to account for the expected change in output power level based on a smallest available adjustment to the power setting. In other words, the stored threshold value may be selected such that a power setting adjustment will not result in exceeding the maximum power level. The stored threshold value may be stored in the memory 53 of other fobs 14 of the same design during the manufacturing process.

As one example, the controller 50 may incrementally increase the output power setting. The increase increment may be a fixed amount based on characteristics of the fob 14 transmitter 52. For example, the output power setting may have a fixed number of values, and the controller 50 may select the next higher value. Alternatively, the increase increment could be calculated based on the feedback signal level. The processor 51 may calculate an adjustment value, based on the feedback signal, indicating how much the output power setting may be increased to approach without exceeding the maximum output power. The processor 51 may then increase the output power setting according to the adjustment value. After increasing the output power setting, the processor 51 may continue to monitor the feedback signal to determine if any further correction is required.

In addition to adjusting an output power setting based on the feedback signal, the processor 51 may be programmed to adjust a tuning of the transceiver antennas 56. For example, the processor 51 may shift a tuning between first and second transceiver antennas 56 such that, e.g., the first transceiver antenna 56 transmits at a higher power level than the second transceiver antenna 56, and determine if the level of the feedback signal increases based on the shift.

In a case where the fob 14 is malfunctioning such that the feedback signal exceeds the stored threshold value, the processor 51 may also be programmed to reduce an output power setting, and/or if the condition persists, disable the fob 14 transmitter 52. Adjustments to other communication parameters may also be made.

The processor 51 may further be programmed to use data from sensors 60 as well as feedback from the feedback mechanism 62 for adjusting the output power setting of the fob 14. As one example, the processor 51 may be programmed, as described above, to adjust the output power setting by a predetermined amount based on data received from the sensors 60. Following the adjustment, the controller 50 may determine based on a feedback signal from the feedback mechanism 62 if a further adjustment is necessary.

Reporting Battery Characteristics

The fob 14 may include a state-of-charge unit (SOC) 66 to estimate the remaining charge in a battery 64. The SOC 66 may measure an output voltage, output current, output resistance, etc., of the battery during operation, and based on these measurements; determine characteristics of the battery 64, e.g., the estimated remaining charge. Based on the determined battery 64 characteristics, the fob 14 may adjust operating characteristics of the fob 14. For example, if it is determined that the battery 64 output voltage is dropping due to a low charge state, the processor 51 may adjust a power setting of the transmitter 52, or adjust other communication parameters. Additionally or alternatively, the fob 14 may report the characteristics to the vehicle 12 base station 16.

Similarly, the base station 16 may, based on the battery 64 characteristics, adjust operation of the base station 16. For example, if the base station 16 receives a message that the estimated remaining charge of the battery 64 is below a first charge threshold level, the base station 16 may increase a sensitivity of the base station 16 receiver 32. The first charge threshold level may be empirically determined as a charge level at which, for example, the output transmit power is decreased by approximately 20% in a fob 14 of a particular design.

As another example, when the base station 16 receives a message that the estimated remaining charge in the battery 64 is below a second charge threshold level, the base station 16 may, for example, via the interface 40, display a message that the battery 64 is near end of life, or if applicable, needs to be recharged. The second charge threshold level may be empirically determined as a charge level at which, for example, the battery 64 can maintain specified operating conditions for an estimated 100 additional fob 14 transmissions. The base station 16 may further, for example, provide the information relating to the battery 64 condition to the operator via the network 21, for example via email.

Exemplary Processes

Figure 4:
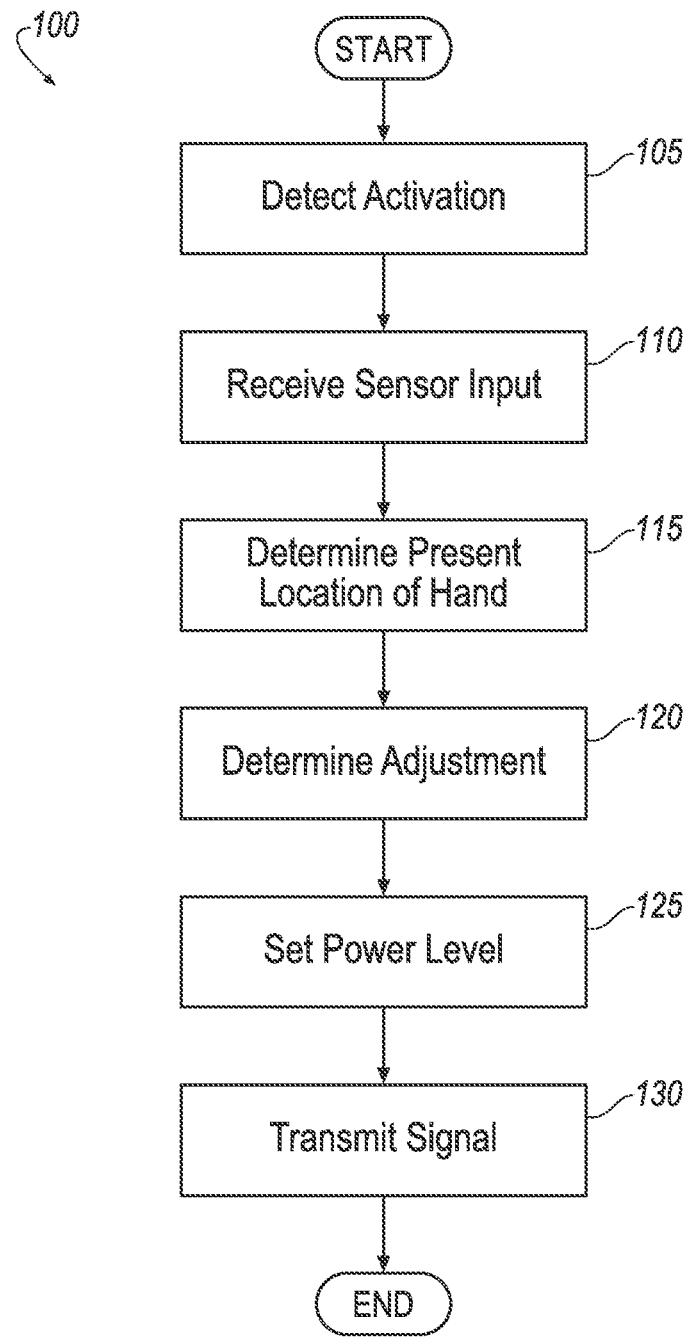
FIG. 4 is a diagram of an exemplary process for adjusting an output power setting based on the detection of a hand operating the fob of FIG. 1.

FIG. 4 is a diagram of an exemplary process 100 for compensating a fob 14 for interference based on the detection of an object proximate the fob 14 transceiver antenna 56, generally carried out according to instructions by the processor 51.

The process 100 begins in a block 105, in which the fob 14 detects an operator input from the interface 20. For example, the interface 20 may include a plurality of buttons. An operator of the vehicle 12 may depress one of the buttons, providing an input to the processor 51. The processor 51 determines, based on the input that the operator would like to transmit a message to the vehicle 12. The process 100 continues in the block 110.

In the block 110, the processor 51 receives input from one or more sensors 60. As described above, the sensors 60 may provide a detection input indicating that an object is in direct contact with the fob 14, and may indicate a position or positions on the fob 14 that are directly contacted by the object. The sensors 60 may additionally indicate if the object is proximate the fob 14 transceiver antenna 56. Further, the sensors 60 may provide other information such as an orientation of the fob 14, movement of the fob 14, etc. The processor 51 may receive and store the input from the sensors 60. The process 100 continues in a block 115.

In the block 115, the processor 51 may determine characteristics of the object. For example, based on the position or positions of the fob 14 in direct contact with the object, the controller 50 may determine that the fob 14 is being held by a hand on the right side or left side. Based on input indicating orientation or movement of the fob 14, the processor 51 may determine, for example, that the fob 14 is being held in a horizontal position. The processor 51 may determine other characteristics of the object, e.g., the extent that the object is covering the fob 14, the conductivity of the object, etc. The process 100 continues in a block 120.

In the block 120, the processor 51 may determine an adjustment for the power level setting. As described above, the output power setting may be adjusted by a predetermined adjustment factor. The predetermined adjustment factor may be a fixed value, or may be selected from a number of predetermined adjustment factors, based on the determined characteristics of the object. The process 100 continues in a block 125.

In the block 125, the processor 51 adjusts an output power setting of the fob 14 transmitter 52 according to the predetermined adjustment factor determined in the block 120. As described above, the processor 51 may send an instruction to the transmitter 52, and based on the instruction, the transmitter 52 may adjust the output power setting to reflect the predetermined adjustment factor. Additionally or alternatively, the processor 51 may adjust other communication parameters. The process 100 continues in a block 130.

In the block 130, the processor 51 instructs the fob 14 transmitter 52 to transmit a message to the vehicle 12. The transmitter 52 transmits the message, at the output power setting set in the block 125. The process 100 may end upon completion of the transmission.

Figure 5:
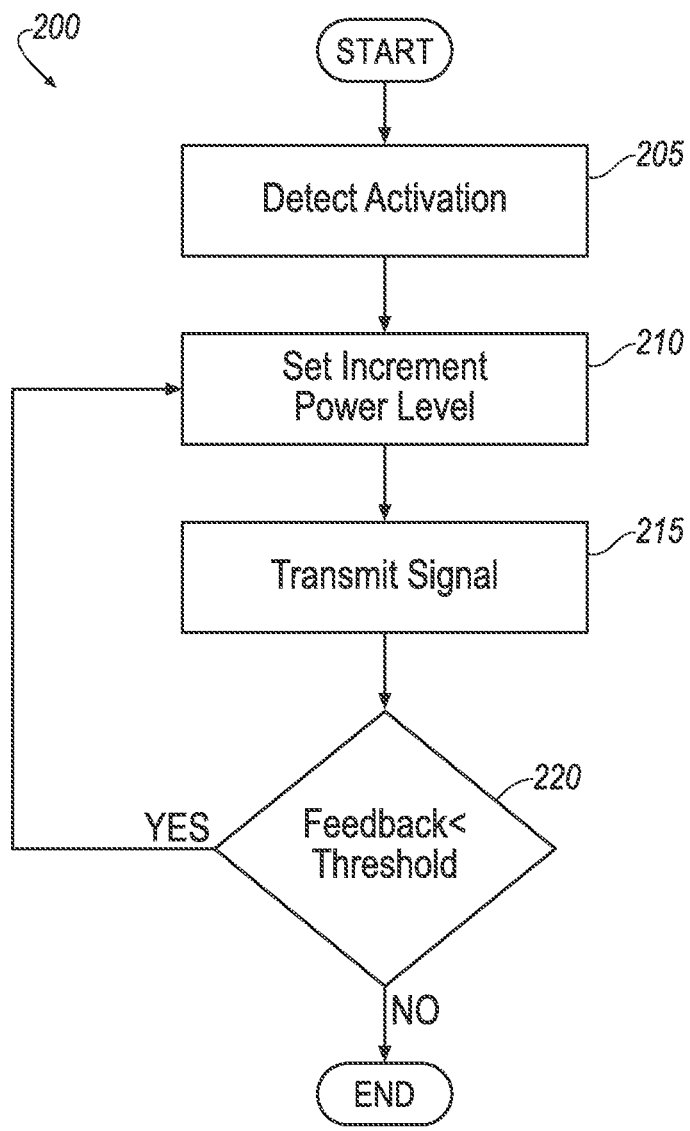
FIG. 5 is a diagram of an exemplary process for using an internal feedback mechanism to adjust an output power setting of the fob of FIG. 1.

FIG. 5 is a diagram of an exemplary process 200 for compensating a fob 14 for interference based on feedback from a feedback mechanism 62, generally carried out according to instructions by the processor 51.

The process 200 begins in a block 205, in which the fob 14 detects an operator input from the interface 20. As described in regard to process 100, the interface 20 may include a plurality of buttons. The operator of the vehicle 12 may depress one of the buttons, providing an input to the controller 50. The processor 51 determines, based on the input that the operator would like to transmit a message to the vehicle 12. The process 200 continues in the block 210.

In the block 210, the processor 51 sets and/or increments the power level setting of the fob 14 transmitter 52. For an initial transmission, following a detection of an operator input in block 205, the processor 51 may set the power level setting at an initial power setting. The initial power level may be, for example, the initial power setting determined from calibration of the fob 14, as described above. For a subsequent transmission, the power setting may be incrementally increased. The increase amount may be a fixed amount, or an amount determined based on the feedback signal value, as described above. Additionally or alternatively, the processor 51 may make adjustments to other communications parameters. The process 200 continues in a block 215.

In the block 215, the fob 14 transmits a message to the vehicle 12. The processor 51 sends an instruction to the transmitter 52 which transmits a message at a power setting as set in the block 210. The process 200 continues in a block 220.

In the block 220, the processor 51 determines if the value of a feedback signal is less than a stored threshold value. The feedback mechanism 62 provides a feedback signal to the controller indicating the output power level of an output signal transmitted from the transmitter 52. The processor 51 compares the feedback signal with the stored threshold value. If the processor 51 determines that the feedback signal is below the stored threshold value, process 200 continues in the block 210 and initiates another transmission at a higher power setting, as described above. If the processor 51 determines that the feedback signal is greater than or equal to the predetermined threshold, the process 200 ends.

The term "exemplary" is used herein in the sense of signifying an example, e.g., a reference to an "exemplary widget" should be read as simply referring to an example of a widget.

In the drawings, the same reference numbers indicate the same elements. Further, some or all of these elements could be changed. Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

The invention claimed is:

1. A method comprising:
    transmitting a first output signal at a first power setting;
    receiving, via a feedback mechanism in a key fob, a first feedback signal indicating a first output power level of the first output signal;
    comparing the first output power level to a threshold level; and
    transmitting a second output signal at a second power setting greater than the first power setting if the first output power level is below the threshold level.

2. The method of claim 1, further comprising:
    receiving, via the feedback mechanism, a second feedback signal indicating a second output power level of the second output signal;
        comparing the second output power level to the threshold level;
            transmitting a third output signal at a third power setting greater than the second power setting if the second output power level is below the threshold level.

3. The method of claim 1, further comprising determining the threshold level from calibration data.

4. The method of claim 1, further comprising determining the first power setting from calibration data.

5. The method of claim 1, wherein the feedback mechanism includes a radio frequency sensing element.

6. The method of claim 1, wherein the key fob includes a plurality of transceiver antennas, the plurality of transceiver antennas including a first transceiver antenna and a second transceiver antenna, the method further comprising:
    receiving a detection signal from a sensor;
    determining a position of an object proximate the key fob based on the detection signal;
    selecting one of the first transceiver antenna and second transceiver antenna to transmit the first output signal based on the determination of the hand position; and
    selecting the other one of the first transceiver antenna and second transceiver antenna to feedback the first output signal to the feedback mechanism.

7. The method of claim 1, further comprising:
    transmitting a fourth output signal at a fourth power setting less than the first power setting if the first output level is above the threshold level.

8. The method of claim 1, wherein the first power setting is increased a first amount to the second power setting, wherein the first amount is based on empirical data.

9. The method of claim 1, wherein comparing the first output power level to the threshold value includes calculating a difference between the first feedback signal and the threshold level and determining the first amount based at least in part on the calculated difference.

10. A key fob comprising:
    a memory device;
    a transmitter;
    a feedback mechanism programmed to provide a first feedback signal; and
    a processor programmed to transmit a first output signal at a first power setting, receive the first feedback signal indicating a first output power level of the first output signal, compare the first output power level to a threshold level and transmit a second output signal at a second power setting if the power level of the first feedback signal is below the threshold level, wherein the second power setting is greater than the first power setting.

11. The key fob of claim 10, wherein the processor is further programmed to receive a second feedback signal indicating a second power level of the second output signal via the feedback mechanism, compare the second output level to the threshold level, and transmit a third signal at a third power setting greater than the second power setting if the second output power level is below the threshold level.

12. The key fob of claim 10, wherein the stored threshold level is determined from calibration data.

13. The key fob of claim 10, wherein the first power setting is determined from calibration data.

14. The key fob of claim 10, wherein the feedback mechanism includes a radio frequency sensing element.

15. The key fob of claim 14, wherein the feedback antenna is a wire trace spaced away from a transceiver antenna included in the key fob.

16. The key fob of claim 10, further comprising:
a plurality of transceiver antennas, the plurality of transceiver antennas including a first transceiver antenna and a second transceiver antenna; and
at least one sensor; wherein the processor is further programmed to:
receive a detection signal from the at least one senor,
determine a position of an object proximate to the key fob based on the detection signal,
select one of the first transceiver antenna and second transceiver antenna to transmit the first output signal based on the determined position of the object; and
select the other one of the first transceiver antenna and second transceiver antenna to feedback the first output signal to the feedback mechanism.

17. The key fob of claim 10, wherein the processor is further programmed to transmit a fourth output signal at a fourth power setting less than the first power setting if the first output power level is greater than the threshold level.

18. The key fob of claim 10, wherein the first power setting is increased a first amount to a second power setting, wherein the first amount is based on empirical data.

19. The key fob of claim 10, wherein comparing the first output power level to the threshold value includes calculating a difference between the first feedback signal and the threshold level and determining the first amount based at least in part on the calculated difference.

20. A key fob comprising:
a memory device;
a transmitter;
a plurality of transceiver antennas including a first transceiver antenna and a second transceiver antenna;
a feedback mechanism programmed to provide a first feedback signal; and
a processor programmed to transmit a first output signal at a first power setting, receive the first feedback signal indicating a first output power level of the first output signal, compare the first output power level to a threshold level and adjust a tuning between the first transceiver antenna and the second transceiver antenna if the power level of the first feedback signal is below the threshold level.

* * * * *